US005219228A

United States Patent [19]

Ker et al.

[11] Patent Number: 5,219,228

[45] Date of Patent: Jun. 15, 1993

[54] EXHAUST GAS TEMPERATURE MEASURING SYSTEM UTILIZING EXISTING OXYGEN SENSOR

[75] Inventors: Eric L. Ker, Tokyo, Japan; Philip R. Peterson, Grand Blanc, Mich.

[73] Assignee: General Motors Corporation, Detroit, Mich.

[21] Appl. No.: 880,787

[22] Filed: May 11, 1992

[51] Int. Cl.[5] ........ G01K 7/16; G01K 13/02; G01R 27/02

[52] U.S. Cl. ........ 374/144; 374/142; 73/116; 324/713

[58] Field of Search ........ 374/144, 142; 73/116; 123/676; 324/713

[56] References Cited

U.S. PATENT DOCUMENTS

| | | | |
|---|---|---|---|
| 4,078,531 | 3/1978 | Hewitt | 374/144 |
| 4,149,408 | 4/1979 | Ezoe et al. | 73/118.1 |
| 4,519,237 | 5/1985 | Kubo | 73/23.21 |
| 4,742,808 | 5/1988 | Blumel et al. | 123/688 |
| 4,768,485 | 9/1988 | Brandner et al. | 123/698 |
| 5,091,698 | 2/1992 | Grabs | 324/713 |
| 5,129,258 | 7/1992 | Homeyer | 73/116 |

FOREIGN PATENT DOCUMENTS

| | | | |
|---|---|---|---|
| 0089482 | 8/1978 | Japan | 374/144 |
| 0058109 | 5/1979 | Japan | 374/144 |

*Primary Examiner*—William A. Cuchlinski, Jr.
*Assistant Examiner*—Diego F. F. Gutierrez
*Attorney, Agent, or Firm*—Vincent A. Cichosz

[57] ABSTRACT

An exhaust gas temperature measuring system for an internal combustion engine derives temperature from an oxygen sensor having a temperature dependent internal resistance disposed in an exhaust gas stream. The oxygen sensor produces an intrinsic voltage which is divided between the internal resistance and an external resistive load. An approximation of the oxygen sensor internal resistance is made from the value of the resistive load providing a value of the loaded sensor voltage having a predetermined relationship to the unloaded sensor voltage; and the internal resistance indicates the exhaust gas temperature.

8 Claims, 3 Drawing Sheets

EXHAUST GAS TEMPERATURE MEASURING SYSTEM UTILIZING EXISTING OXYGEN SENSOR

BACKGROUND

Legislation mandating stringent limits on certain exhaust emissions from motor vehicle internal combustion engines has resulted in widespread use of closed-loop fuel control systems and three-way catalytic converters for oxidizing hydrocarbons and carbon monoxide while simultaneously reducing oxides of nitrogen in the exhaust gas. Exhaust emissions are influenced by, among other things, the air/fuel ratio of the engine fuel charge, combustion temperature and converter temperature.

The air/fuel ratio of the engine fuel charge affects the efficiency of three-way catalytic converters and, therefore, influences the exhaust emissions. Thus, a vehicle so equipped is also equipped with a closed-loop fuel control system for maintaining a stoichiometric air/fuel ratio which maximizes the efficiency of catalytic converter operation. The exhaust emissions of such vehicles are also influenced by combustion temperature and converter temperature. Elevated combustion temperature is known to increase the production of oxides of nitrogen in the exhaust gases. However, elevated converter temperature is desirable for proper converter operation; but converter temperature above a certain limit may damage the converter and thus permanently reduce its efficiency. Exhaust gas temperature is a good indicator of both combustion temperature and converter temperature, since it is a direct result of the former and a significant contributor to the latter. An exhaust gas temperature sensor may, therefore, be useful for additional control or monitoring functions in engine controls using three-way catalytic converters and closed-loop fuel control systems. In prior art devices, dedicated thermocouples or thermistors have been employed for sensing exhaust gas temperature; but their addition, along with required external amplification circuitry, can significantly increase the expense of a fuel control system intended for mass production.

SUMMARY

The oxygen sensor used in many such closed-loop fuel control systems is capable of providing a signal representative of exhaust gas temperature without the addition of the thermocouples and thermistors of the prior art. The oxygen sensor has an internal resistance appearing in series with the sensor's internally generated, excess oxygen responsive intrinsic voltage; and this internal resistance varies with temperature. Since the sensor is exposed to the exhaust gas stream, the sensor internal resistance varies with exhaust gas temperature.

This invention adds to such an oxygen sensor apparatus which measures an unloaded sensor voltage across the sensor's terminals, loads the sensor with an external resistive load and measures the loaded terminal voltage across the terminals. The invention further comprises apparatus for determining the internal resistance of the sensor from the measured loaded and unloaded sensor voltages and the resistive load. A preferred embodiment of the invention varies the resistive load until the loaded sensor voltage equals substantially one-half the unloaded sensor voltage, whereby the internal resistance is assumed to approximate the value of the resistive load. The resistive load may be varied in a variety of ways, such as by selecting fixed resistors in a switching resistor circuit or by varying the resistance of a variable resistive device such as a field effect transistor. When the oxygen sensor is used as part of a closed-loop control system, the invention may override the closed-loop control and establish a rich air/fuel ratio so as to produce a constant high intrinsic voltage in the oxygen sensor for the duration of the measurements.

By utilizing such an oxygen sensor which is already disposed in the exhaust gas stream, the additional expense of added thermocouples or thermistors and their amplifiers may be avoided. Further, the invention exploits the intrinsic voltage generated by the oxygen sensor, so that no external voltage source is required for the loaded and unloaded sensor voltage measurements. Further details and advantages of the invention will be apparent from the accompanying drawings and following description of the preferred embodiment.

DETAILED DESCRIPTION OF THE PREFERRED EMBODIMENT

Figure 1:
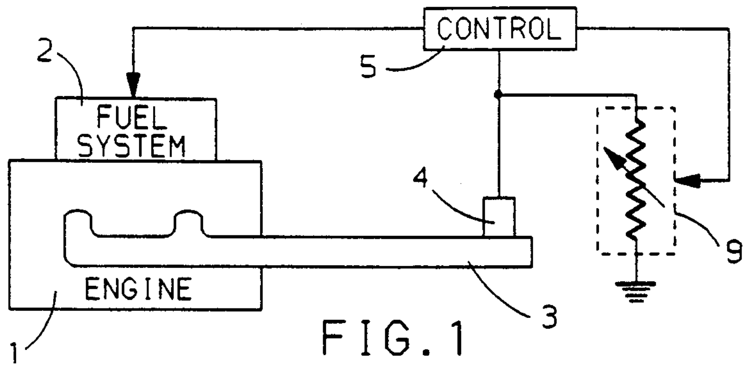
FIG. 1 is a block diagram of an exhaust gas temperature measuring system according to the invention.
Figure 2:
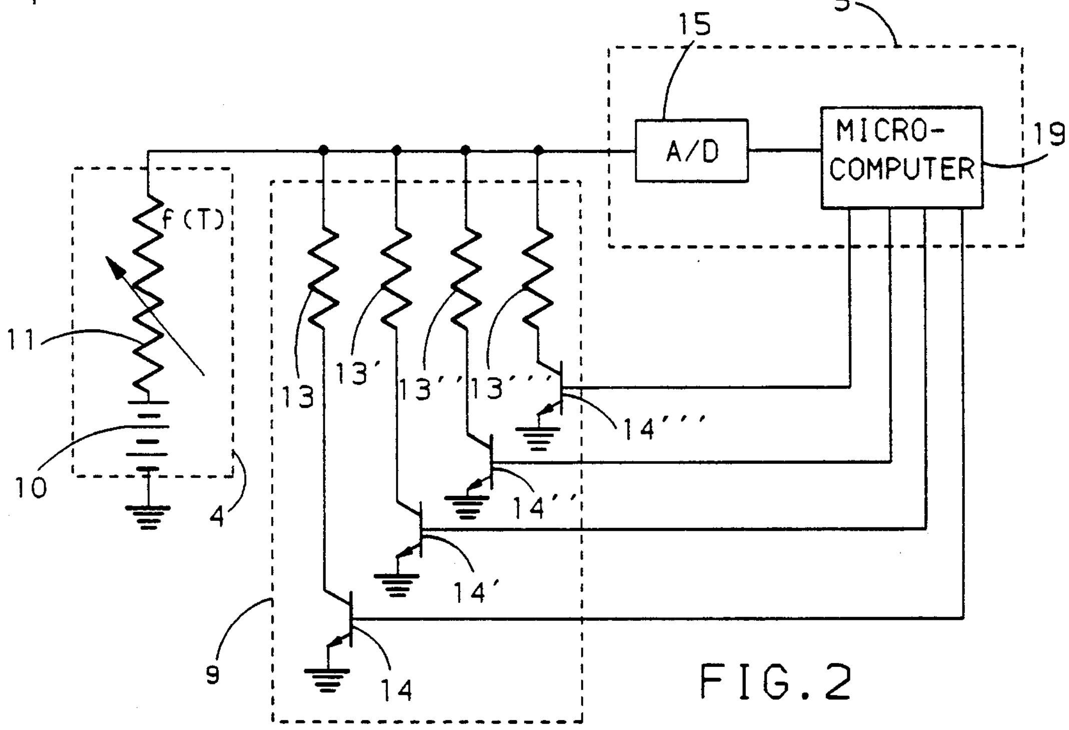
FIG. 2 shows a first embodiment of an exhaust gas temperature measuring system as shown in FIG. 1.

Referring to FIG. 1, an internal combustion engine 1 has combustion chambers into which a fuel charge is delivered by a fuel system 2. After the fuel charge has been ignited and has completed its burn, the exhaust gases are forced through an exhaust conduit 3 away from the engine. In the stream of exhaust gas is disposed an oxygen sensor 4, such as a zirconia based oxygen sensor, the function of which is to detect from the exhaust gas constituents whether the fuel charge is rich or lean and to produce distinct output voltage values corresponding to rich and lean conditions. Referring now to FIG. 2, the oxygen sensor 4 is modeled as a DC voltage source 10 (hereinafter referred to as oxygen sensor intrinsic voltage) connected in series with a temperature dependent resistance 11 (hereinafter referred to as oxygen sensor internal resistance). The oxygen sensor 4 is effective to produce a low voltage value when excess oxygen is detected in the exhaust gas stream, corresponding to a lean fuel charge, and is effective to produce a high voltage value when no excess oxygen is detected in the exhaust gas stream, corresponding to a rich fuel charge. Referring back to FIG. 1, the output voltage values from the sensor are monitored by a control 5 having very high input resistance relative to the oxygen sensor internal resistance. This high impedance approximates an open circuit across the oxygen sensor terminals and allows negligible current to flow through the oxygen sensor internal resistance. The negligible current through the oxygen sensor internal resistance produces a negligible voltage drop from the oxygen sensor intrinsic voltage to the oxygen sensor terminals; and, therefore, the voltage across the oxygen sensor terminals is the equivalent of the oxygen sensor intrinsic voltage. It follows that any effect that the oxygen sensor internal resistance has upon the effectiveness of the oxygen sensor as a voltage signal generator in such a configuration with control 5 is also negligible. The control 5 responds to the oxygen sensor intrinsic voltage by adjusting the fuel system 2 to deliver a fuel charge having a predetermined air/fuel ratio. The predetermined ratio is essentially stoichiometric and the adjustments are made to maintain this ratio. Together, the engine 1, fuel system 2, exhaust conduit 3, oxygen sensor 4 and control 5 combine to make up a closed-loop stoichiometric fuel control system. The foregoing is well known to those skilled in the art.

In the present invention, the oxygen sensor internal resistance is determined by utilizing the oxygen sensor intrinsic voltage and internal resistance in combination with an external resistive load to establish a voltage division circuit. The voltage division circuit effectively divides the oxygen sensor intrinsic voltage across the oxygen sensor internal resistance and external resistive load in proportion to the respective resistance values. The internal resistance can be derived from a loaded oxygen sensor terminal voltage value, an unloaded oxygen sensor terminal voltage value, and a known resistive load applied across the oxygen sensor terminals.

A convenient resistive load for use in deriving the oxygen sensor internal resistance is one that causes an equal division of the oxygen sensor intrinsic voltage across the oxygen sensor internal resistance and the resistive load applied across the oxygen sensor terminals. If one-half the oxygen sensor intrinsic voltage is dropped across the resistive load, then it follows that the remaining one-half is dropped across the oxygen sensor internal resistance and the resistive load is equal to the oxygen sensor internal resistance. Knowing the resistive load which produces an equal division of the oxygen sensor intrinsic voltage yields the oxygen sensor internal resistance with minimal computation since it will be equal to the resistive load. Further convenience is realized with equal division due to the relative ease of binary computations and comparisons of values which are multiples of two in digital computer apparatus. In this preferred embodiment, such comparisons and computations will be made as described below in explanation of an EXHAUST TEMP program described in the flow chart of FIG. 5. Since the oxygen sensor internal resistance changes with temperature, so too will the resistive load which provides an equal voltage division. For this reason, a resistive load is desirable which effectively covers the range of resistance values of the oxygen sensor internal resistance in the range of temperatures to be measured. The block diagram of FIG. 1 shows the oxygen sensor terminals connected to a resistive load 9 which is controlled in value by the control 5 to establish a voltage division circuit. The range of values through which the resistive load varies corresponds to the range of values which the oxygen sensor internal resistance takes on in the range of temperatures to be measured.

In the preferred embodiment of FIG. 2, the resistive load 9 comprises a plurality of four discreet resistors 13, 13', 13'' and 13''' each of which is connected across the oxygen sensor terminals in series with a corresponding transistor 14, 14', 14'' and 14'''. While four resistors and corresponding transistors are shown in FIG. 2, it is merely illustrative of the circuit arrangement and the embodiment is not restricted to any particular number of discreet resistors and corresponding transistors. It is preferable to have a plurality of discreet resistors whose values are distributed such that they correspond to oxygen sensor internal resistance values associated with temperatures of interest. The preferred embodiment distributes the resistance values to correspond to equally spaced temperatures throughout the entire range of temperatures to be measured so as to provide balanced temperature coverage within the range. For example, with a plurality of four discreet resistors, if the range of temperatures to be measured is 700 degrees F. to 1000 degrees F., resistance values corresponding to 700, 800, 900 and 1000 degrees F. are chosen. Each transistor 14 functions as a solid state switch responsive to the control 5. None of resistors 13, 13',13'' and 13''' is electrically connected across the oxygen sensor terminals until its corresponding transistor 14, 14', 14'' and 14''' is commanded into saturation by the control 5. Each individual resistor 13, 13', 13' and 13''' has a predetermined unique value and is switched in circuit across the oxygen sensor terminals independently and to the exclusion of the remaining resistors. Each resistor 13, 13', 13'' and 13''' when in circuit across the oxygen sensor terminals, serves to complete a voltage division circuit in combination with the oxygen sensor intrinsic voltage and the oxygen sensor internal resistance.

While the preferred embodiment utilizes individual resistors whose values may correspond to equally spaced temperatures, it is not intended as the only practicable or feasible distribution of the plurality of resistors. Another possible embodiment distributes the resistance values to correspond to variably spaced temperatures throughout the entire range of temperatures to be measured so as to provide focused temperature coverage through specific temperature areas of particular interest within the range. For example, with a plurality of four resistors, if the range of temperatures to be measured is 700 degrees F. to 1000 degrees F., with focused temperature coverage between 900 and 1000 degrees F., resistance values corresponding to 700, 900, 950 and 1000 degrees F. may be chosen. Accordingly, the discreet resistors 13, 13', 13'', 13''' and their distribution will differ in this embodiment from those in the preferred embodiment.

Continuing with reference to FIG. 2, the control 5 comprises an analog to digital converter 15 and a microcomputer 19. The analog to digital converter 15 provides the microcomputer 19 with digital numbers representing the voltage values across the oxygen sensor terminals. The microcomputer 19 has a plurality of outputs corresponding in number to the plurality of discreet resistors 13, 13', 13'', 13''' for the purpose of controlling the switching of each transistor 14, 14', 14'', 14''' independently of the other transistors. The microcomputer 19 is further effective to cause the fuel system 2 to enrich the fuel charge so that a stable high intrinsic sensor voltage is developed during the period in which the EXHAUST TEMP program is being executed. It is advantageous to maintain the sensor intrinsic voltage at its high value since the high voltage value maximizes accuracy of measurements due to the relative stability and magnitude of the resulting intrinsic voltage. This is accomplished by overriding the closed-loop stoichiometric fuel control system so as to maintain the fuel charge on the rich side which results in exhaust gas constituents that produce a high oxygen sensor voltage value. The microcomputer 19 also performs all control and calculations indicated by the EXHAUST TEMP program as described hereafter in reference to FIG. 5.

Figure 5:
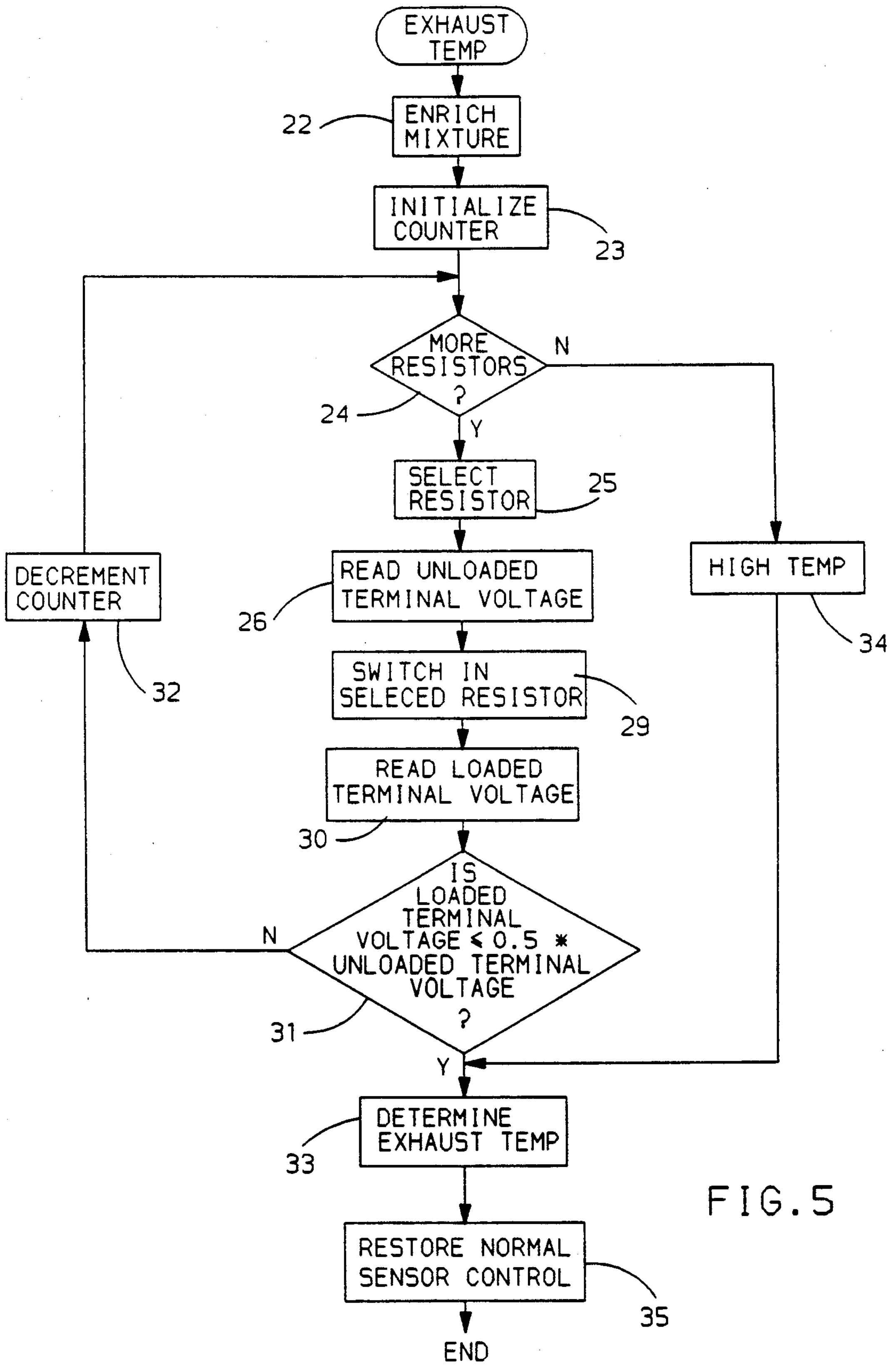
FIG. 5 shows a flow chart describing the operation of the embodiment of FIG. 2 in deriving exhaust gas temperature.

The flow chart of FIG. 5. indicates how the EXHAUST TEMP program controls the apparatus to derive the temperature of the oxygen sensor and thus the temperature of the exhaust gas from the oxygen sensor internal resistance. According to this embodiment and corresponding flow chart, the oxygen sensor internal resistance value is approximated to be the resistance value of one of the resistors from the plurality of resistors. More specifically, the oxygen sensor internal resistance value is approximated to be the value which causes substantially one-half an unloaded oxygen sensor voltage, the unloaded oxygen sensor voltage being equivalent to the oxygen sensor intrinsic voltage, to be dropped across it when electrically connected across the oxygen sensor terminals.

Beginning with sequence block 22, the apparatus first initiates the override of the closed-loop stoichiometric fuel control system so that a rich fuel charge is introduced into the engine. Details of this step will vary with the specific fuel control system and are well known to those skilled in the art. Generally, however, this involves ignoring the actual sensor output and generating a false signal within the control to produce a rich mixture while freezing any integrator and disabling any learning control. The output of the oxygen sensor is maintained at its high voltage value due to the resulting exhaust gas constituents. At sequence block 23, a counter is initialized which corresponds to the number of resistors available in the plurality of resistors. Decision block 24 is next encountered and will have an affirmative response on the first pass through the flow chart since more resistors will be available for selection in subsequent passes through the flow chart. At sequence block 25, an initial resistor is selected which has the largest resistance value available from the plurality of resistors. Further selections of resistors will occur sequentially according to decreasing resistance values on subsequent passes through the flow chart.

The flow chart continues to sequence block 26 where an unloaded oxygen sensor voltage value is measured across the oxygen sensor terminals without any resistor electrically connected thereto. Sequence block 29 next causes the currently selected resistor to be electrically connected across the oxygen sensor terminals so as to load the oxygen sensor. This is accomplished by the microcomputer commanding the selected resistor's corresponding transistor into saturation so as to switch the resistor into the circuit. A loaded oxygen sensor voltage value is now measured across the oxygen sensor terminals as indicated by sequence block 30. At this point, decision block 31 compares the loaded oxygen sensor voltage value to the unloaded oxygen sensor voltage value and determines if the resistance value of the currently selected resistor causes substantially one-half the unloaded oxygen sensor voltage to be dropped across the currently selected resistor. This can be accomplished in a digital computer by a one bit shift of one of the digital numbers representing a voltage followed by a comparison. If the currently selected resistor causes one-half or less of the unloaded oxygen sensor voltage to be dropped across it, then it is considered to cause a substantially one-half voltage drop and is therefore an adequate approximation of the oxygen sensor internal resistance for use in deriving the exhaust gas temperature in sequence block 33. Since the most recent previous pass through the flow chart—if one occurred—did not select a resistor which caused one-half or less of the unloaded oxygen sensor voltage to be dropped across it, yet the current pass did select such a resistor, then it is apparent that the resistance value which causes exactly one-half the unloaded oxygen sensor voltage to be dropped across it is between the resistance values of the previously and currently selected resistors or equal to the currently selected resistor. The resistance value of either the previously or currently selected resistor could be used to approximate the oxygen sensor internal resistance value since they bound the actual value which would produce a one-half voltage drop. However, the resistance value of the currently selected resistor is more convenient since it is possible that the initial resistor selected satisfies the conditions of decision block 31 affirmatively, in which case no previously selected resistor exists from which to approximate the oxygen sensor internal resistance. Therefore, the currently selected resistor which satisfies affirmatively decision block 31 is considered to cause substantially one-half the unloaded oxygen sensor voltage to be dropped across it; and its resistance value is an adequate approximation of the oxygen sensor internal resistance value. If the currently selected resistor causes greater than one-half the unloaded oxygen sensor voltage to be dropped across it, then the resistance value of the currently selected resistor is not considered to cause a substantially one-half voltage drop and is therefore an inadequate approximation of the oxygen sensor internal resistance.

If the currently selected resistor is inadequate, the program proceeds from decision block 31 to sequence block 32 where the counter is decremented by one so that the counter now indicates the number of resistors remaining which have yet to be utilized. From sequence block 32, the program continues at decision block 24 as previously described. If the program runs out of resistors at decision block 24 with the selected resistor still inadequate, then the exhaust gas temperature is still higher than the range of interest; and this fact can be stored in a HIGH TEMP flag at sequence block 34. If the currently selected resistor is adequate, however, the flow chart continues to sequence block 22 for determination of exhaust gas temperature. Sequence block 33 determines the temperature corresponding to the oxygen sensor internal resistance as approximated by the selected resistor from a lookup table. An alternate method for transforming a value of internal resistance into temperature is using a mathematical formula established by experimentation or theoretical methods. Finally, from either of sequence blocks 33 or 34, the closed-loop control is restored to normal sensor control at sequence block 35 before the program is ended.

The foregoing description of the flow chart of FIG. 5 is illustrative of one way to approximate the oxygen sensor internal resistance using the preferred embodiment. Alternatively, it is feasible to select an initial resistor which has the smallest resistance value available from the plurality of resistors and to further select resistors sequentially according to increasing resistance values on subsequent passes through the flow chart. In this case, decision block 31 voltage value comparison math operator changes from $\leqq$ to $\geqq$ and sequence block 34 would clearly provide a LOW TEMP, rather than a HIGH TEMP, flag. Another alternate method within the scope of this invention for approximating the oxygen sensor internal resistance is determining it to be the resistance value of the resistor from the plurality of resistors which causes a voltage drop closest to one-half the unloaded oxygen sensor voltage. In this embodiment, the ratios of loaded to unloaded sensor voltages may be calculated for each resistor so the closest resistor can be identified. Even greater accuracy can be achieved in approximating the oxygen sensor internal resistance value through interpolation of a resistance value between two resistors bounding the actual resistance value which would cause one-half the unloaded oxygen sensor voltage to be dropped across it; and the calculated ratios may be used in this interpolation. Further, the oxygen sensor internal resistance can be approximated mathematically from the unloaded oxygen sensor voltage, the loaded oxygen sensor voltage considered to be substantially one-half the unloaded oxygen sensor voltage, and the known resistance value which causes substantially one-half the unloaded oxygen sensor voltage to be dropped across it. These non-exclusive alternatives are described above only briefly as they are readily achievable by one skilled in the art.

Figure 3:
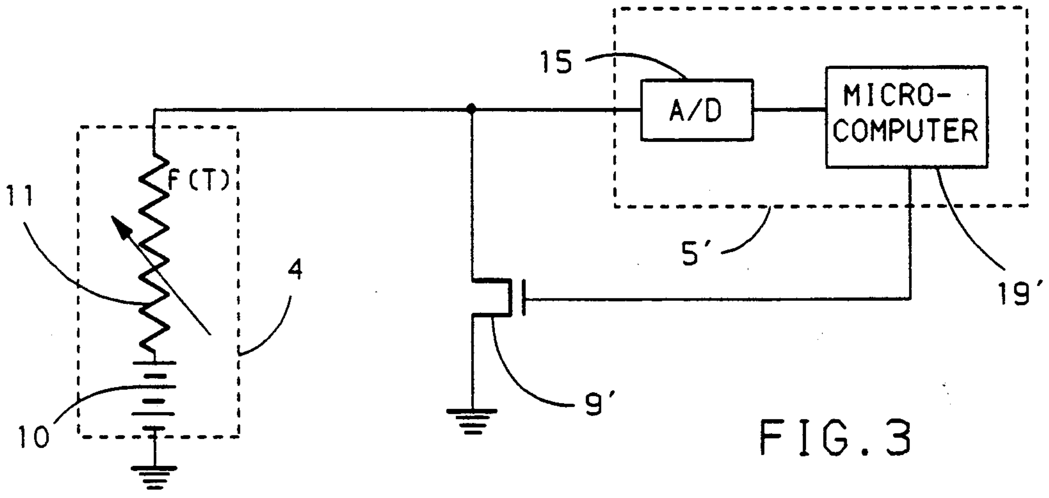
FIG. 3 shows a second embodiment of an exhaust gas temperature measuring system as shown in FIG. 1.

Although the preferred embodiment uses multiple discreet resistors 13, 13', 13'', 13''' it is noted that alternatives exist for resistive loads. One such alternative is to employ continuously variable semiconductor resistance means such as a field effect transistor (FET) as a resistive load 9' as shown in FIG. 3. The oxygen sensor 4 in such an embodiment is identical to the oxygen sensor in the preferred embodiment. In applying a FET as the resistive load 9', it is possible to cover the range of values which the oxygen sensor internal resistance takes on in the range of temperatures to be measured with a single variable element as opposed to a plurality of discreet resistors 13, 13', 13'', 13'''. A microcomputer 19, in such an embodiment receives digital data representing the voltage value across the oxygen sensor terminals from an analog to digital converter 15 in an identical manner to the preferred embodiment; however, control of the resistive load value is accomplished by the microcomputer 19' via a single output designed to apply a variable gate voltage to control the resistance value of the FET. This particular embodiment also requires computation by the microcomputer 19' of the resistive load value from the variable gate voltage.

Figure 4:
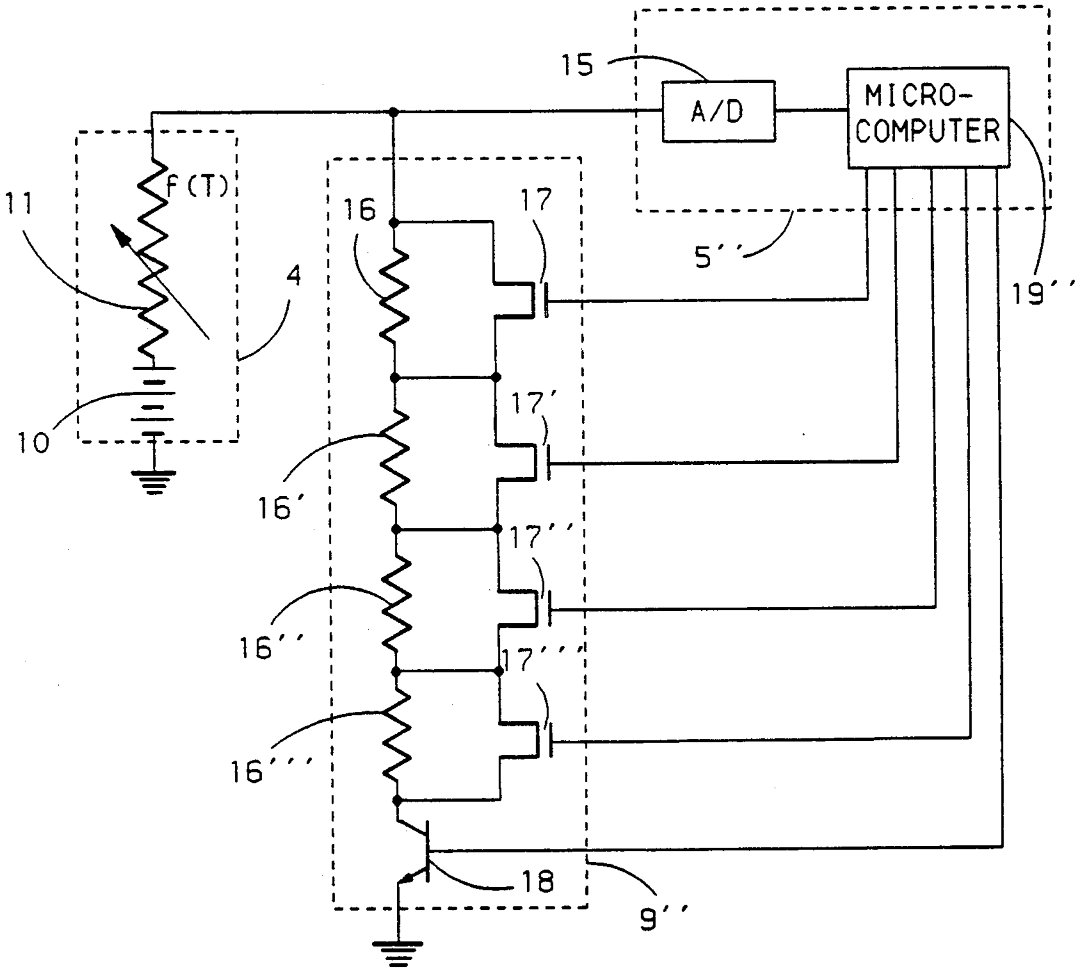
FIG. 4 shows a third embodiment of an exhaust gas temperature measuring system as shown in FIG. 1.

Another resistive load alternative, illustrated in the embodiment of FIG. 4, employs, as resistive load 9'', a plurality of resistors 16, 16', 16'' and 16''' connected in series with each other and in series with a single switching transistor 18. Each resistor 16, 16', 16'' and 16''' is further connected in parallel with a corresponding FET 17, 17', 17'' and 17'''. Various combinations of the individual resistance values are obtained by controlling the state of each FET so as to either short or open the FET across its corresponding resistor. The switching transistor 18 is effective to load and unload the sensor terminals with the various combinations of the resistors This alternative allows for $2^n-1$ useful combinations of resistance values from a plurality of n resistors. One possible value is essentially a short across the sensor terminals when all resistors are shorted and consequently is useless as a resistive load and potentially damaging to the circuit. For a plurality of four resistors 16, 16', 16'' and 16''', $2^n-1$ equals 15 useful combinations. A microcomputer 19'' in such an embodiment receives digital data representing the voltage value across the oxygen sensor terminals from an analog to digital converter 15 in an identical manner to the preferred embodiment; however, control of the resistive load value is accomplished by the microcomputer 19'' via the plurality of outputs similar to the preferred embodiment yet not limited to exclusive switching of the resistors 16, 16', 16'' and 16''' one at a time, rather expanded to include combinations of the resistors 16, 16', 16'' and 16''' established by simultaneous non-exclusive switching of the resistors 16, 16', 16'' and 16'''. One useful arrangement of resistance values for such a series arrangement is the well known binary multiple arrangement, wherein each resistor has half the resistance of the previous resistor. This allows the resistance of the possible combinations of resistors to range over almost twice the value of the largest resistance to the value of the smallest resistance in steps close to the value of the smallest resistance.

The embodiments of the invention in which an exclusive property or privilege is claimed are defined as follows:

1. An exhaust gas temperature measuring system for an internal combustion engine having an oxygen sensor connected to provide an input to a closed-loop stoichiometric fuel control system, the oxygen sensor characterized by an intrinsic voltage responsive to an air/fuel ratio to generate a low voltage value in response to a lean air/fuel ratio and a high voltage value in response to a rich air/fuel ratio comprising, in combination:

an oxygen sensor disposed in an exhaust gas stream of the engine, the oxygen sensor having an internal resistance corresponding to exhaust gas temperature according to a known relationship and further having means for generating an intrinsic voltage electrically in series with the internal resistance between a pair of terminals;

means for measuring an unloaded sensor voltage across the pair of terminals;

means for loading the sensor with a known resistive load across the pair of terminals and measuring a loaded sensor voltage across the pair of terminals;

means for determining the internal resistance exclusively from the loaded and unloaded sensor voltages; and means for determining the exhaust gas temperature corresponding to the internal resistance according to the known relationship.

2. An exhaust gas temperature measuring system as claimed in claim 1 further comprising means for overriding the input to the closed-loop stoichiometric fuel control system and establishing a rich air/fuel ratio thus generating the high voltage value during operation of the means for measuring the unloaded sensor voltage and the means for measuring the loaded sensor voltage.

3. An exhaust gas temperature measuring system as claimed in claim 1 wherein the means for loading the sensor is effective to vary the resistive load across the sensor terminals to provide different loaded sensor voltages.

4. An exhaust gas temperature measuring system as claimed in claim 3 wherein the means for determining the internal resistance determines the internal resistance to be a value of the resistive load which causes a loaded sensor voltage that is substantially one-half the unloaded sensor voltage.

5. An exhaust gas temperature measuring system as claimed in claim 1 wherein the resistive load comprises a plurality of resistors of known resistance values each individually connectable across the pair of sensor terminals by a corresponding semiconductor switch means, and the means for loading the sensor is effective to selectively activate the semiconductor switch means to connect each resistor independently across the pair of sensor terminals to cause correspondingly different values of loaded sensor voltages, and the internal resistance is derived from the unloaded sensor voltage and a selected one of the values of the loaded sensor voltages substantially one-half the unloaded sensor voltage.

6. An exhaust gas temperature measuring system as claimed in claim 1 wherein the resistive load comprises a variable semiconductor resistor means connected across the pair of sensor terminals, and the means for loading the sensor is effective to change the resistance of the variable semiconductor resistor means to cause correspondingly different values of loaded sensor voltages, and the internal resistance is derived from the unloaded sensor voltage and a selected one of the values of the loaded sensor voltages substantially one-half the unloaded sensor voltage.

7. An exhaust gas temperature measuring system as claimed in claim 6 wherein the variable semiconductor resistor means is a field effect transistor.

8. An exhaust gas temperature measuring system as claimed in claim 1 wherein the resistive load comprises a plurality of resistors of known resistance values connected in series and connectable across the pair of sensor terminals by a semiconductor switch means, each resistor further being individually connected in parallel with a corresponding semiconductor switch means, and the means for loading the sensor is effective to short each resistor independently via the corresponding semiconductor switch means to cause correspondingly different values of loaded sensor voltages, and the internal sensor resistance is derived from the unloaded sensor voltage and a selected one of the values of the loaded sensor voltages substantially one-half the unloaded sensor voltage.

* * * * *